(12) United States Patent
Teramoto

(10) Patent No.: US 6,917,115 B2
(45) Date of Patent: Jul. 12, 2005

(54) ALIGNMENT PATTERN FOR A SEMICONDUCTOR DEVICE MANUFACTURING PROCESS

(75) Inventor: Chieri Teramoto, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/307,404

(22) Filed: Dec. 2, 2002

(65) Prior Publication Data

US 2003/0102576 A1 Jun. 5, 2003

(30) Foreign Application Priority Data

Nov. 30, 2001 (JP) ........................................ 2001-366099

(51) Int. Cl.⁷ .............................................. H01L 27/10
(52) U.S. Cl. ...................... 257/774; 257/522; 257/758; 257/760; 257/773
(58) Field of Search ............................... 257/774, 773, 257/522, 758, 760

(56) References Cited

U.S. PATENT DOCUMENTS

| | | | | |
|---|---|---|---|---|
| 5,002,902 A | | 3/1991 | Watanabe | |
| 5,466,628 A | * | 11/1995 | Lee et al. | 438/386 |
| 5,770,484 A | * | 6/1998 | Kleinhenz | 438/155 |
| 6,080,659 A | | 6/2000 | Chen et al. | |
| 6,461,925 B1 | * | 10/2002 | John et al. | 438/309 |
| 6,620,703 B2 | * | 9/2003 | Kunikiyo | 438/422 |
| 6,638,822 B2 | * | 10/2003 | Chang | 438/257 |

FOREIGN PATENT DOCUMENTS

| | | | | |
|---|---|---|---|---|
| JP | 63-237433 | * | 10/1988 | 438/975 |
| JP | 7-147225 | * | 6/1995 | |
| JP | B2 2897248 | | 3/1999 | |
| JP | A 2000-174022 | | 6/2000 | |

* cited by examiner

Primary Examiner—Alexander Oscar Williams
(74) Attorney, Agent, or Firm—Young & Thompson

(57) ABSTRACT

An alignment pattern comprises at least a sloped surface which communicates between a top surface of an inter-layer insulator extending over a surface of a substrate and a field oxide film selectively formed over the surface of the substrate and a flat surface of a metal plug, and the flat surface being lower in level than the top surface of the inter-layer insulator. The metal plug is buried within an alignment hole which completely penetrates the insulation layer and at least reaches the field oxide film, so that the alignment hole has a bottom level which is deeper than a bottom level of the inter-layer insulator.

28 Claims, 11 Drawing Sheets

ALIGNMENT PATTERN FOR A SEMICONDUCTOR DEVICE MANUFACTURING PROCESS

BACKGROUND OF THE INVENTION

1. Field of the Invention

The present invention relates to an alignment pattern and a method of forming the same, and more particularly to an alignment pattern to be used for measuring a degree of misalignment in alignment process for patterning a metal interconnection film and a method of forming the same.

All of patents, patent applications, patent publications, scientific articles and the like, which will hereinafter be cited or identified in the present application, will, hereby, be incorporated by references in their entirety in order to describe more fully the state of the art, to which the present invention pertains.

2. Description of the Related Art

An alignment pattern is used for alignment to an existent pattern in order to form a new pattern without any displacement or misalignment with reference to the existent pattern.

There has been known a variety of alignment pattern with various shapes, for example, a box-mark which comprises a rectangle-shaped frame. A resist film is formed over the alignment pattern, so that the resist film has a surface which includes a level-difference or steps caused by the presence of the alignment pattern. The steps comprise slopes which provide boundaries between high-level and low-level regions of the surface of the resist film. The uniformity or symmetry in gradient of the slopes in connection with the single alignment pattern indicates the accuracy in alignment. The non-uniformity, variation or asymmetry in gradient of the slopes in connection with the single alignment pattern indicates the degree of miss-alignment.

One typical example of the alignment pattern may be a rectangular-flame-shaped pattern which will be referred to as a box-mark. The resist film is formed over the box-mark, so that the resist film has a surface which has steps which extend on a rectangular-flame-shaped region in plan view. The steps comprise sloped surfaces which provide boundaries between a rectangular-shaped inside flat surface and a surrounding outside flat surface which surrounds the rectangular-shaped inside flat surface. In one example, the rectangular-shaped inside flat surface has a lower level than the surrounding outside flat surface. The rectangular-shaped inside flat surface is communicated through the sloped surfaces as the steps to the surrounding outside flat surface.

The uniformity or symmetry of the distance in plan view between the rectangular-shaped inside flat surface and the surrounding outside flat surface indicates the accuracy of alignment. Namely, the uniformity or symmetry of the slope-distance of the steps or the sloped surfaces indicates the accuracy of alignment. The non-uniformity or asymmetry of the distance in plan view between the rectangular-shaped inside flat surface and the surrounding outside flat surface indicates the degree of miss-alignment. Namely, the non-uniformity or asymmetry of the slope-distance of the steps or the sloped surfaces indicates the degree of miss-alignment.

The alignment pattern of this box-mark may, for example, comprise the sloped surfaces which provide boundaries between a flat higher level surface of an inter-layer insulator and a flat lower level surface of a metal plug buried within an alignment hole formed in the inter-layer insulator, wherein the alignment hole has a rectangle-shape in plan view.

A contact hole for the box-mark is formed in the inter-layer insulator. A metal plug is buried within the contact hole. An etch-back is carried out to the surface of the buried metal plug to planarize the surface of the metal plug, whereby steps or sloped surfaces are formed between the planarized lower level surface of the metal plug and the planarized higher level surface of the inter-layer insulator. Namely, the contact hole has the steps or the sloped surfaces. An interconnection layer is formed over the inter-layer insulator and the contact hole, whereby the interconnection layer also has the steps or the sloped surfaces.

The high planarity can be obtained by a chemical mechanical polishing and a high temperature sputtering process of aluminum. In place of the etch-back process, the chemical mechanical polishing is used for planarization of the metal plug buried within the contact hole.

FIGS. 1A and 1B are fragmentary cross sectional elevation views of sequential steps involved in a conventional method for forming an alignment pattern.

As shown in FIG. 1A, a titanium silicide layer 2 is formed over a silicon substrate 1. An inter-layer insulator 3 comprising a boron phospho-silicate glass is formed over the titanium silicide layer 2. A scribe line for dividing a wafer comprises a diffusion layer. A contact hole is formed in a region of the diffusion layer. Not only a contact hole 4 having a diameter of not more than 0.5 micrometers is formed in the diffusion layer for an internal circuit but also an alignment hole 5 having a diameter of not less than 15 micrometers is also formed in an alignment region.

As shown in FIG. 1B, a tungsten plug 6 is formed over the, inter-layer insulator 3 and within the contact hole 4 and the alignment bole 5, whereby the contact hole 4 and the alignment hole 5 are completely filled with the tungsten plug 6. A chemical mechanical polishing is carried out to the tungsten plug 6 for planarization thereof, whereby the contact hole 4 and the alignment hole 5 have steps or level-difference. Namely, the tungsten plug 6 buried within each of the contact hole 4 and the alignment hole 5 has a planarized lower-level surface lower in level than the surface of the inter-layer insulator 3 and a sloped or stepped peripheral region, which surrounds the planarized lower-level surface and bounds the planarized lower-level surface from the surface of the inter-layer insulator 3. The planarized lower-level surface is bounded by the sloped or stepped peripheral region from the surface of the inter-layer insulator 3. The planarized lower-level surface of the tungsten plug 6 is surrounded by the sloped or stepped peripheral region of the upper surface of the tungsten plug 6. The tungsten plug 6 within the alignment hole 5 has steps which provide a level-difference "d" of about 50 nanometers. The sloped or stepped peripheral region serves as a box-mark. An aluminum interconnection layer 7 is formed over the surface of the inter-layer insulator 3 as well as over the planarized lower-level surfaces and the sloped or stepped peripheral regions of the tungsten plugs 6 within the contact hole 4 and the alignment hole 5.

FIG. 2 shows a conventional alignment pattern in a fragmentary cross sectional view and a fragmentary plan view as well as read out data about the steps.

The above-described processes shown in FIGS. 1A and 1B have been completed, thereby the aluminum interconnection layer 7 is formed over the surface of the inter-layer insulator 3 as well as over the planarized lower-level surfaces and the sloped or stepped peripheral regions of the tungsten plugs 6 within the contact hole 4 and the alignment hole 5. A resist film 8 is formed over the aluminum interconnection layer 7. The resist film 8 is then patterned with an alignment which is made by detecting the box-mark 9 which comprises the sloped surfaces or the steps in the alignment hole 5, for which purpose a scanning to the surface of the substrate is made in a direction shown in an arrow mark across a pair of opposite sides of the box-mark 9. As a result of the scanning, any level-differences can be detected as peak waveforms. The presence of the box-mark 9 which comprises the sloped surfaces or the steps forms further sloped surfaces or steps of the surface of the resist pattern 8. The further sloped surfaces or steps of the surface of the resist pattern 8 due to the presence of the box-mark 9 are represented to be peak waveforms "A" and "D". The resist pattern 8 also has a square-shaped resist pattern hole 8-a, so that a part of the planarized lower-level surface of the tungsten plug 6 within the alignment hole 5 is exposed through the resist pattern hole 8-a. A periphery of the resist pattern hole 8-a is represented to be peak waveforms "B" and "C".

If the planarization is carried out by the chemical mechanical polishing to the tungsten plug 6, then the level-difference or the sloped steps of the box-mark 9 is small even the alignment hole 5 has a larger diameter. The small level-difference of the box-mark 9 makes it difficult to detect the level-difference of the surface of the resist pattern 8 for the following reasons.

The chemical mechanical polishing to the tungsten plug 6 reduces a plug-loss of the tungsten plug 6, thereby reducing the level-difference between or the sloped steps as boundaries between the planarized lower-level surface of the tungsten plug 6 and the surface of the inter-layer insulator 3. The reduction in the level-difference or the sloped steps causes a broader and gentle waveform which is hard to be detected.

Meanwhile, the degree of miss-alignment of the resist pattern 8 with reference to the alignment hole 5 may be detected by comparing a first distance and a second distance, wherein the first distance is defined to be a distance between the waveform peak "B" representing one vertical wall of the resist pattern hole 8-a and the waveform peak "A" representing one sloped step of the box-mark 9, while the second distance is defined to be another distance between the waveform peak "C" representing opposite vertical wall of the resist pattern hole 8-a and the waveform peak "D" representing opposite sloped step of the box-mark 9. If the first and second distance are substantially the same, then this means that the alignment is almost perfect. The degree of the miss-alignment may read on the difference between the first and second distances.

The broader and gentle waveforms due to the reduction in the level-difference or the sloped steps of the box-mark 9 reduces the accuracy in measuring the difference between the first and second distances or in detecting the degree of the miss-alignment.

In the above circumstances, the development of a novel alignment pattern and a method of forming the same free from the above problems is desirable.

SUMMARY OF THE INVENTION

Accordingly, it is an object of the present invention to provide a novel alignment pattern free from the above problems.

It is a further object of the present invention to provide a novel alignment pattern which allows a scanning process to ensure a highly accurate detection of any level-difference or any step by reading a waveform peak which represents the level-difference or the step, even if a planarization process is carried out by using a chemical mechanical polishing.

It is a still further object of the present invention to provide a novel method of forming an alignment pattern free from the above problems.

It is yet a further object of the present invention to provide a novel method of forming an alignment pattern which allows a scanning process to ensure a highly accurate detection of any level-difference or any step by reading a waveform peak which represents the level-difference or the step, even if a planarization process is carried out by using a chemical mechanical polishing.

The present invention provides an alignment pattern comprising: at least a sloped surface which communicates between a top surface of an inter-layer insulator extending over a surface of a substrate and a field oxide film selectively formed over the surface of the substrate and a flat surface of a metal plug, and the flat surface being lower in level than the top surface of the inter-layer insulator. The metal plug is buried within an alignment hole which completely penetrates the insulation layer and at least reaches the field oxide film, so that the alignment bole has a bottom level which is deeper than a bottom level of the inter-layer insulator.

The present invention also provides a method of forming an alignment pattern comprising the steps of: selectively forming a field oxide film over a substrate; forming an inter-layer insulator over a surface of the substrate and the field oxide film; forming an alignment hole which completely penetrates the insulation layer and at least reaches the field oxide film, so that the alignment hole has a bottom level which is deeper than a bottom level of the inter-layer insulator; and forming a metal plug buried within the alignment hole, the metal plug having a flat surface lower in level than a top surface of the inter-layer insulator and sloped surfaces serving as an alignment pattern which communicate between the top surface of the inter-layer insulator and the flat surface of the metal plug.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1A:
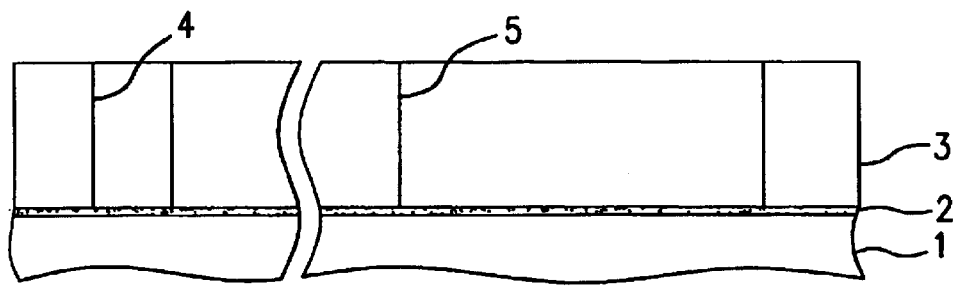
FIGS. 1A and 1B are fragmentary cross sectional elevation views of sequential steps involved in a conventional method for forming an alignment pattern.

A first aspect of the present invention is an alignment pattern comprising: at least a sloped surface which communicates between a top surface of an inter-layer insulator extending over a surface of a substrate and a field oxide film selectively formed over the surface of the substrate and a flat surface of a metal plug, and the flat surface being lower in level than the top surface of the inter-layer insulator. The metal plug is buried within an alignment hole which completely penetrates the insulation layer and at least reaches the field oxide film, so that the alignment hole has a bottom level which is deeper than a bottom level of the inter-layer insulator.

It is preferable that the alignment hole completely penetrates not only the inter-layer insulator but also the field oxide film, so that the bottom level of the alignment hole is deeper than a bottom level of the field oxide film.

It is also preferable that the alignment hole has an aspect ratio which ensures that the at least sloped surface be remarkable even the at least sloped surface is obtained by a chemical mechanical polishing process for the metal plug.

It is also preferable that the at least sloped surface has a level-difference of not less than 200 nanometers.

It is also preferable that the field oxide film comprises an upper half portion above the surface of the substrate and a lower half portion below the surface of the substrate, and the lower half portion is thicker than the upper half portion.

It is also preferable that a majority part of the field oxide film is buried within the substrate.

It is also preferable that at least a most part of the field oxide film is buried within the substrate.

A second aspect of the present invention is a semiconductor device including: a substrate; a field oxide film selectively formed over the substrate; an inter-layer insulator extending over a surface of the substrate and the field oxide film; an alignment hole which completely penetrates the insulation layer and at least reaches the field oxide film, so that the alignment hole has a bottom level which is deeper than a bottom level of the inter-layer insulator; and a metal plug buried within the alignment hole, the metal plug having a flat surface lower in level than a top surface of the inter-layer insulator and sloped surfaces serving as an alignment pattern which communicate between the top surface of the inter-layer insulator and the flat surface of the metal plug.

It is preferable that the alignment hole completely penetrates not only the inter-layer insulator but also the field oxide film, so that the bottom level of the alignment hole is deeper than a bottom level of the field oxide film.

It is also preferable that the alignment hole has an aspect ratio which ensures that the at least sloped surface be remarkable even the at least sloped surface is obtained by a chemical mechanical polishing process for the metal plug.

It is also preferable that the at least sloped surface has a level-difference of not less than 200 nanometers.

It is also preferable that the field oxide film comprises an upper half portion above the surface of the substrate and a lower half portion below the surface of the substrate, and the lower half portion is thicker than the upper half portion.

It is also preferable that a majority part of the field oxide film is buried within the substrate.

It is also preferable that at least a most part of the field oxide film is buried within the substrate.

A third aspect of the present invention is an alignment pattern comprising: sloped surfaces of an interconnection layer extending both over a top surface of an inter-layer insulator and within an alignment hole. The sloped surfaces are positioned over a periphery of the alignment hole. The inter-layer insulator extends over a surface of a substrate and a field oxide film selectively formed over the surface of the substrate. The alignment hole completely penetrates the insulation layer and at least reaches the field oxide film, so that the alignment hole has a bottom level which is deeper than a bottom level of the inter-layer insulator.

It is also preferable that the alignment hole completely penetrates not only the inter-layer insulator but also the field oxide film, so that the bottom level of the alignment hole is deeper than a bottom level of the field oxide film.

It is also preferable that the alignment hole has an aspect ratio which ensures that the at least sloped surface be remarkable even the interconnection layer is re-flown.

It is also preferable that the field oxide film comprises an upper half portion above the surface of the substrate and a lower half portion below the surface of the substrate, and the lower half portion is thicker than the upper half portion.

It is also preferable that a majority part of the field oxide film is buried within the substrate.

It is also preferable that at least a most part of the field oxide film is buried within the substrate.

A fourth aspect of the present invention is a semiconductor device including: a substrate; a field oxide film selectively formed over the substrate; an inter-layer insulator extending over a surface of the substrate and the field oxide film; an alignment hole which completely penetrates the insulation layer and at least reaches the field oxide film, so that the alignment hole has a bottom level which is deeper than a bottom level of the inter-layer insulator; and an interconnection layer extending both over the top surface of the inter-layer insulator and within the alignment hole, and the interconnection layer having sloped surfaces serving as an alignment pattern positioned over a periphery of the alignment hole.

It is also preferable that the alignment hole completely penetrates not only the inter-layer insulator but also the field oxide film, so that the bottom level of the alignment hole is deeper than a bottom level of the field oxide film.

It is also preferable that the alignment hole has an aspect ratio which ensures that the at least sloped surface be remarkable even the interconnection layer is re-flown.

It is also preferable that the field oxide film comprises an upper half portion above the surface of the substrate and a lower half portion below the surface of the substrate, and the lower half portion is thicker than the upper half portion.

It is also preferable that a majority part of the field oxide film is buried within the substrate.

It is also preferable that at least a most part of the field oxide film is buried within the substrate.

A fifth aspect of the present invention is a method of forming an alignment pattern comprising the steps of: selectively forming a field oxide film over a substrate; forming an inter-layer insulator over a surface of the substrate and the field oxide film; forming an alignment hole which completely penetrates the insulation layer and at least reaches the field oxide film, so that the alignment hole has a bottom level which is deeper than a bottom level of the inter-layer insulator; and forming a metal plug buried within the alignment hole, the metal plug having a flat surface lower in level than a top surface of the inter-layer insulator and sloped surfaces serving as an alignment pattern which communicate between the top surface of the inter-layer insulator and the flat surface of the metal plug.

It is also preferable that the alignment hole completely penetrates not only the inter-layer insulator but also the field oxide film, so that the bottom level of the alignment hole is deeper than a bottom level of the field oxide film.

It is also preferable that the alignment hole has an aspect ratio which ensures that the at least sloped surface be remarkable even the at least sloped surface is obtained by a chemical mechanical polishing process for the metal plug.

It is also preferable that the at least sloped surface has a level-difference of not less than 200 nanometers.

It is also preferable that the field oxide film is formed by a local oxidation of silicon method.

It is also preferable that the field oxide film is formed by a recessed local oxidation of silicon method, so that the field oxide film comprises an upper half portion above the surface of the substrate and a lower half portion below the surface of the substrate, and the lower half portion is thicker than the upper half portion.

It is also preferable that the field oxide film is formed by a recessed local oxidation of silicon method, so that a majority part of the field oxide film is buried within the substrate.

It is also preferable that the field oxide film is formed in a trench groove of the substrate so that at least a most part of the field oxide film is buried within the substrate.

A sixth aspect of the present invention is a method of forming an alignment pattern comprising the steps of: selectively forming a field oxide film over a substrate; forming an inter-layer insulator over a surface of the substrate and the field oxide film; forming an alignment hole which completely penetrates the insulation layer and at least reaches the field oxide film, so that the alignment hole has a bottom level which is deeper than a bottom level of the inter-layer insulator; and forming an interconnection layer both over the top surface of the inter-layer insulator and within the alignment hole, and the interconnection layer having sloped surfaces serving as an alignment pattern positioned over a periphery of the alignment hole.

It is also preferable that the alignment hole completely penetrates not only the inter-layer insulator but also the field oxide film, so that the bottom level of the alignment hole is deeper than a bottom level of the field oxide film.

It is also preferable that the alignment hole has an aspect ratio which ensures that the at least sloped surface be remarkable even the interconnection layer is re-flown.

It is also preferable that the field oxide film is formed by a local oxidation of silicon method.

It is also preferable that the field oxide film is formed by a recessed local oxidation of silicon method, so that the field oxide film comprises an upper half portion above the surface of the substrate and a lower half portion below the surface of the substrate, and the lower half portion is thicker than the upper half portion.

It is also preferable that the field oxide film is formed by a recessed local oxidation of silicon method, so that a majority part of the field oxide film is buried within the substrate.

It is also preferable that the field oxide film is formed in a trench groove of the substrate so that at least a most part of the field oxide film is buried within the substrate.

The following embodiments are typical examples for practicing the foregoing aspects of the present invention. Although the subject matters of the present invention have been described in details, the following additional descriptions in one or more typical preferred embodiments or examples will be made with reference to the drawings for making it easy to understand the typical modes for practicing the foregoing aspects of the present invention.

Figure 3:
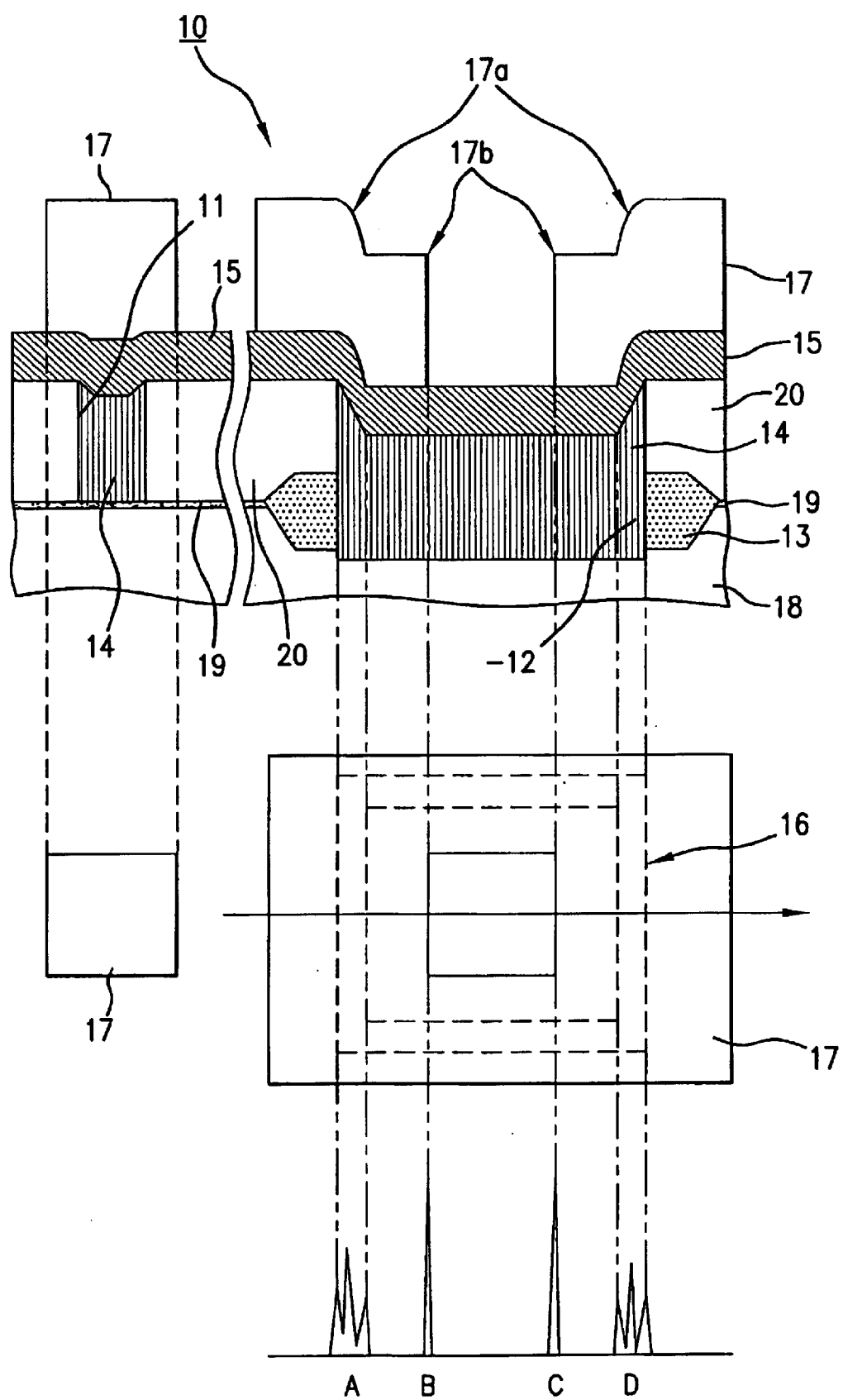
FIG. 3 shows a novel alignment pattern over a substrate in a fragmentary cross sectional view and a fragmentary plan view as well as waveform peaks representing the steps in a first embodiment in accordance with the present invention.

First Embodiment:

A first embodiment according to the present invention will be described in detail with reference to the drawings. FIG. 3 shows a novel alignment pattern over a substrate in a fragmentary cross sectional view and a fragmentary plan view as well as waveform peaks representing the steps in a first embodiment in accordance with the present invention.

A semiconductor device 10 is formed over a silicon substrate 18. A tungsten silicide film 19 is formed over a surface of the silicon substrate 18. A field oxide film 13 is selectively formed over the surface of the silicon substrate 18. An inter-layer insulator 20 is formed over the tungsten silicide film 19 and the field oxide film 13. The inter-layer insulator 20 may comprise a boron phospho silicate glass. A contact hole 11 is formed in the inter-layer insulator 20, so that the contact hole 11 is positioned over the tungsten silicide film 19, wherein a bottom of the contact hole 11 reaches the tungsten silicide film 14.

An alignment hole 12 is formed, which penetrates the inter-layer insulator 20 and the field oxide film 13 so that a bottom of the alignment hole 12 reaches an upper region of the silicon substrate 18, whereby a part of the silicon substrate 18 is exposed through the alignment hole 12. The bottom level of the alignment hole 12 is deeper than the bottom level of the contact hole 11, and also deeper than the bottom level of the field oxide film 13. A diameter or size of the alignment hole 12 is also much larger than the contact hole 11 to cause required remarkable slopes on a periphery of the top of the alignment hole 5.

A tungsten plug 14 is formed to completely fill or bury both the contact hole 11 and the alignment hole 12. The tungsten plug 14 is selectively removed by a chemical mechanical polishing, so that the tungsten plug 14 remains only within the contact hole 11 and the alignment hole 12. The tungsten plug 14 within the contact hole 11 has an upper surface which includes a first lower level flat surface lower than a top surface of the inter-layer insulator 20 and first sloped surfaces which surround a periphery of the first lower level flat surface, wherein the first sloped surfaces provide a boundary between the first lower level flat surface of the tungsten plug 14 within the contact hole 11 and the top surface of the inter-layer insulator 20. Namely, the first lower level flat surface of the tungsten plug 14 communicates through the first sloped surfaces to the top surface of the inter-layer insulator 20.

The tungsten plug 14 within the alignment hole 12 has another upper surface which includes a second lower level flat surface lower than the top surface of the inter-layer insulator 20 and second sloped surfaces which surround another periphery of the second lower level flat surface, wherein the second sloped surfaces provide another boundary between the second lower level flat surface of the tungsten plug 14 within the alignment hole 12 and the top surface of the inter-layer insulator 20. Namely, the second lower level flat surface of the tungsten plug 14 within the alignment hole 12 communicates through the second sloped surfaces to the top surface of the inter-layer insulator 20. The second sloped surfaces of the tungsten plug 14 extend to form a rectangle-frame shape in plan view. The second sloped surfaces of the tungsten plug 14 within the alignment hole 12 have a larger slope length than the first sloped surfaces of the tungsten plug 14 within the contact hole 11. The second lower level flat surface of the tungsten plug 14 within the alignment hole 12 is lower than the first lower level flat surface of the tungsten plug 14 within the contact hole 11.

An aluminum interconnection layer 15 is formed over the top surface of the inter-layer insulator 20 and also over the first lower level flat surface and the first sloped surfaces of the tungsten plug 14 within the contact hole 11 as well as over the second lower level flat surface and the second sloped surfaces of the tungsten plug 14 within the alignment hole 12. The aluminum interconnection layer 15 has a surface which reflects the top surfaces of the inter-layer insulator 20 and the tungsten plugs 14 within the contact hole 11 and the alignment hole 12.

A resist pattern 17 is formed over the aluminum interconnection layer 15. The resist pattern 17 has a surface which reflects the top surfaces of the inter-layer insulator 20 and the tungsten plugs 14 within the contact hole 11 and the alignment hole 12, wherein the surface of the resist pattern 17 has first steps 17a which reflect the second sloped surfaces of the tungsten plug 14 within the alignment hole 12.

The second sloped surfaces included in the upper surface of the tungsten plug 14 within the alignment hole 12 form a box-mark 16 which serves as an alignment pattern for alignment between a mask pattern and a resist pattern. The resist pattern 17 has a rectangle-shaped opening. An alignment is made by detecting the box-mark 16 which comprises the second sloped surfaces in the alignment hole 12 with reference to the second steps 17b of the rectangle-shaped opening of the resist pattern 17.

In order to detect the box-mark 16, a scanning to the surface of the resist pattern 17 and the aluminum interconnection layer 15 is made in a direction shown in an arrow mark across a pair of opposite sides of the box-mark 16 as shown in FIG. 3. As a result of the scanning, any level-differences can be detected as peak waveforms. The presence of the box-mark 16 which comprises the second sloped surfaces forms large dual-sloped surfaces 17a of the resist pattern 17. The further sloped surfaces 17a of the resist pattern 17 due to the presence of the box-mark 16 are represented to be peak waveforms "A" and "D". The resist pattern 17 also has a square-shaped resist pattern hole with steps 17b, so that a part of the aluminum interconnection layer 15 over the second lower-level flat surface of the tungsten plug 14 within the alignment hole 12 is exposed through the resist pattern hole with the steps 17b of the resist pattern 17. A periphery with the steps 17b of the resist pattern bole is represented to be peak waveforms "B" and "C".

In accordance with the present invention, the deep alignment hole 12 penetrates not only the inter-layer insulator 20 but also the field oxide film 13. The deep alignment hole 12 has a larger aspect ratio which is defined to be a ratio of a depth to a diameter. Both the larger aspect ratio and the large diameter of the alignment hole 12 cause a large plug loss by a chemical mechanical polishing. The term "plug loss" is a difference in level between the planarized surface of the metal plug subjected to the chemical mechanical polishing. The large plug loss allows the second sloped surfaces with a remarkable level-difference to be formed on the periphery of the upper surface of the tungsten plug 14 within the alignment hole 12 even the planarization to the tungsten plug 14 is carried out by the chemical mechanical polishing. The remarkable level-difference or remarkable sloped surfaces of the box-mark 16 causes a remarkable or sharp peak waveform which makes it easy to detect the further sloped surfaces 17a or the level-difference of the surface of the resist pattern 17.

Meanwhile, the degree of miss-alignment of the resist pattern 17 with reference to the alignment hole 5 may be detected by comparing a first distance and a second distance, wherein the first distance is defined to be a distance between the waveform peak "B" representing one step 17b of the resist pattern hole and the waveform peak "A" representing one sloped step of the box-mark 16, while the second distance is defined to be another distance between the waveform peak "C" representing opposite step 17b of the resist pattern hole and the waveform peak "D" representing opposite sloped step of the box-mark 16. If the first and second distance are substantially the same, then this means that the alignment is almost perfect. The degree of the miss-alignment may read on the difference between the first and second distances or read on the degree of asymmetry.

The remarkable waveform peaks, due to the remarkable level-difference or the remarkable sloped surfaces of the box-mark 9 caused by the larger aspect ratio of the deeper alignment hole 12, ensure a desired high accuracy in measuring the difference between the first and second distances or in detecting the degree of the miss-alignment.

FIGS. 4A through 4E are fragmentary cross sectional views of semiconductor devices with novel alignment patterns in sequential steps involved in a novel method for forming the novel alignment pattern shown in FIG. 3 in the first embodiment in accordance with the present invention.

Figure 4A:
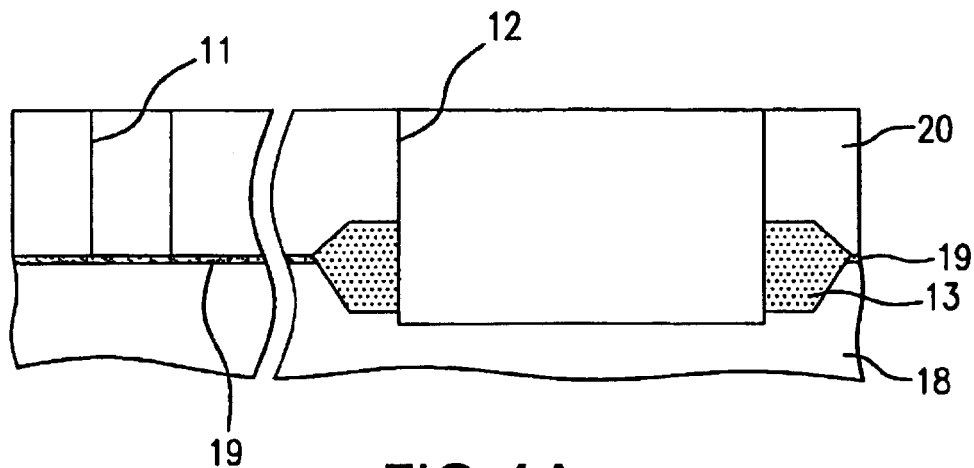
FIGS. 4A through 4E are fragmentary cross sectional views of semiconductor devices with novel alignment patterns in sequential steps involved in a novel method for forming the novel alignment pattern shown in FIG. 3 in the first embodiment in accordance with the present invention.

As shown in FIG. 4A, a tungsten silicide film 19 is formed over a surface of a silicon substrate 18, wherein the tungsten silicide film 19 reduces a resistance of the diffusion layer. A field oxide film 13 is selectively formed over the surface of the silicon substrate 18, so that the field oxide film 13 extends over an alignment mark formation region, in which an alignment hole will be formed in later process, wherein a diameter or a horizontal size of the alignment hole is smaller than the alignment mark formation region. An inter-layer insulator 20 is formed over the tungsten silicide film 19 and the field oxide film 13. The inter-layer insulator 20 may comprise a boron phospho silicate glass. Alternatively, the inter-layer insulator 20 may also comprise a phospho silicate glass. The field oxide film 13 is preferably thicker than the usual field oxide film. An example of the thickness of the field oxide film 13 may be 300 nanometers. The field oxide film 13 has an upper part above the tungsten silicide film 19 and a lower part below the tungsten silicide film 19, wherein preferably, the lower part is thicker than the upper part. The field oxide film 13 deeply extends in the silicon substrate 18.

A scribe line for dividing a wafer comprises a diffusion layer. In a scribe line formation region, a contact hole 11 is formed in the inter-layer insulator 20 by a selective etching process, so that the contact hole 11 is positioned over the tungsten silicide film 19, wherein a bottom of the contact hole 11 reaches the tungsten silicide film 14. The contact hole 11 may have a diameter which may be not larger than 0.5 micrometers. The contact hole 11 is to connect an interconnection and an internal circuit. Further, an alignment hole 12 is formed on the alignment hole formation region, wherein the alignment hole 12 penetrates the inter-layer insulator 20 and the field oxide film 13 so that a bottom of the alignment hole 12 reaches an upper region of the silicon substrate 18, whereby a part of the silicon substrate 18 is exposed through the alignment hole 12. The alignment hole 12 may have a diameter of not smaller than 15 micrometers. A typical example of the thickness of the alignment hole 12 may be about 40 micrometers. A diameter or size of the alignment hole 12 is also much larger than the contact hole 11 to cause required remarkable slopes on a periphery of the top of the alignment hole 5. The bottom level of the alignment hole 12 is deeper than the bottom level of the contact hole 11, and also deeper than the bottom level of the field oxide film 13. In this example, the bottom level of the alignment hole 12 is deeper than the bottom level of the field oxide film 13 and reaches the upper region of the silicon substrate 18. Alternatively, it is also possible that the alignment hole 12 reaches the field oxide film 13 but does not penetrate the field oxide film 13, wherein the bottom level of the alignment hole 12 is just or in the vicinity of the bottom level of the field oxide film 13.

Figure 4B:
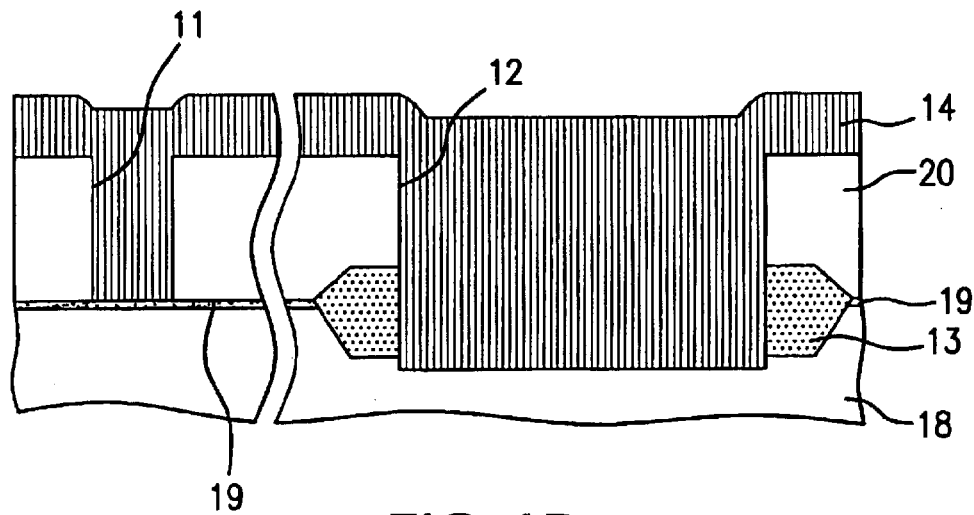

As shown in FIG. 4B, a tungsten plug 14 is formed over an entirety of the surface of the inter-layer insulator 20 by a chemical vapor deposition, so that the tungsten plug 14 completely fills or buries both the contact hole 11 and the alignment hole 12. A bottom of the tungsten plug 14 within the contact hole 11 is in contact with a part of the tungsten silicide film 19. The tungsten plug 14 within the alignment hole 12 penetrates the inter-layer insulator 20 and the field oxide film 13, so that the bottom of the tungsten plug 14 reaches the upper region of the silicon substrate 18.

Figure 4C:
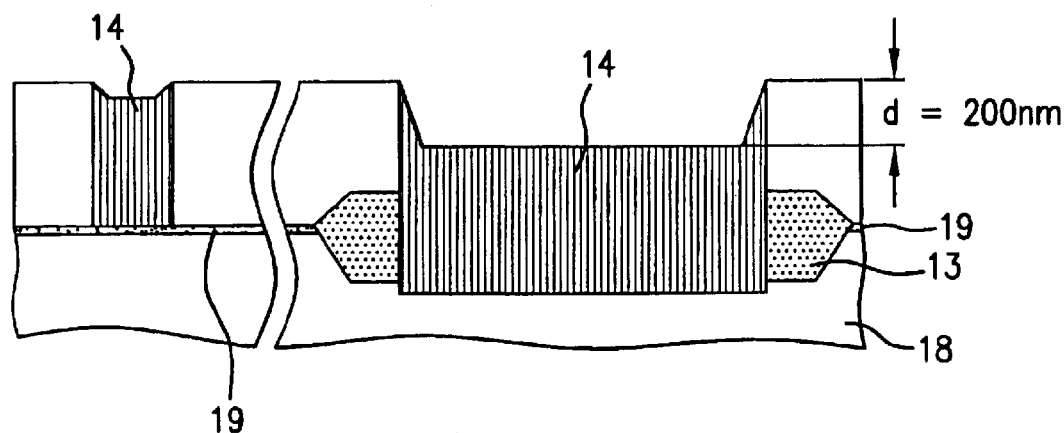
Figure 4D:
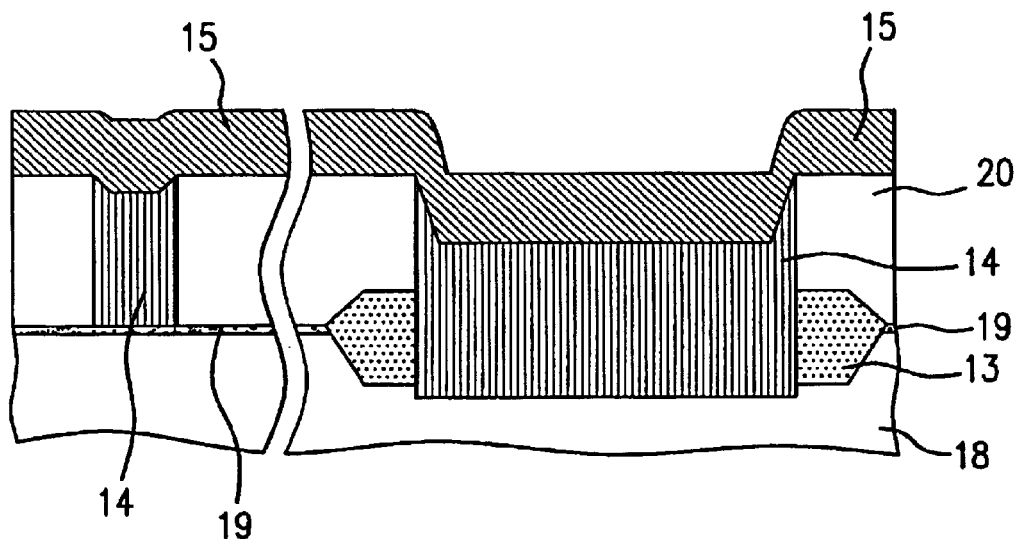

As shown in FIG. 4C, the tungsten plug 14 is selectively removed by a chemical mechanical polishing, so that the tungsten plug 14 remains only within the contact hole 11 and the alignment hole 12. The tungsten plug 14 within the contact hole 11 has an upper surface which includes a first lower level flat surface lower than a top surface of the inter-layer insulator 20 and first sloped surfaces which surround a periphery of the first lower level flat surface, wherein the first sloped surfaces provide a boundary between the first lower level flat surface of the tungsten plug 14 within the contact hole 11 and the top surface of the inter-layer insulator 20. Namely, the first lower level flat surface of the tungsten plug 14 communicates through the first sloped surfaces to the top surface of the inter-layer insulator 20.

After the chemical mechanical polishing, the tungsten plug 14 within the alignment hole 12 has another upper surface which includes a second lower level flat surface lower than the top surface of the inter-layer insulator 20 and second sloped surfaces which surround another periphery of the second lower level flat surface, wherein the second sloped surfaces provide another boundary between the second lower level flat surface of the tungsten plug 14 within the alignment hole 12 and the top surface of the inter-layer insulator 20. Namely, the second lower level flat surface of the tungsten plug 14 within the alignment hole 12 communicates through the second sloped surfaces to the top surface of the inter-layer insulator 20. The second sloped surfaces of the tungsten plug 14 extend to form a rectangle-frame shape in plan view. The second sloped surfaces of the tungsten plug 14 within the alignment hole 12 have a larger slope length than the first sloped surfaces of the tungsten plug 14 within the contact hole 11. The second lower level flat surface of the tungsten plug 14 within the alignment hole 12 is lower than the first lower level flat surface of the tungsten plug 14 within the contact hole 11.

Figure 1B:
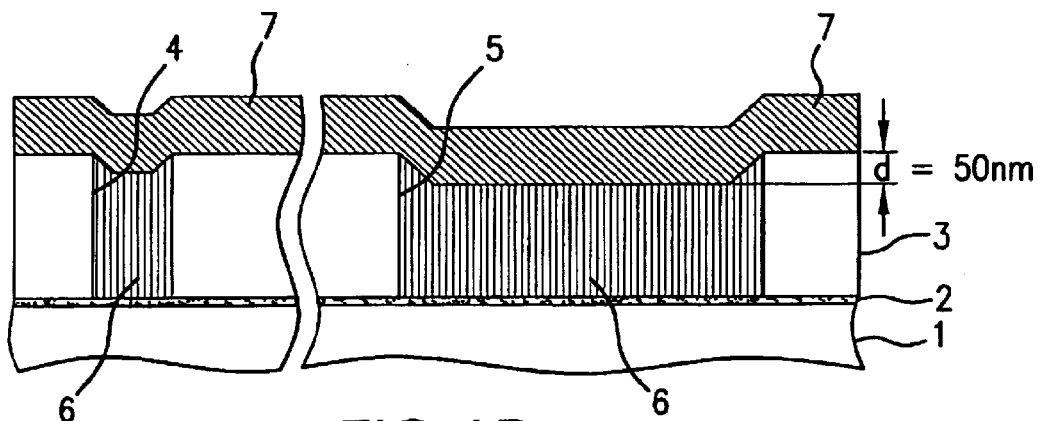
Figure 2:
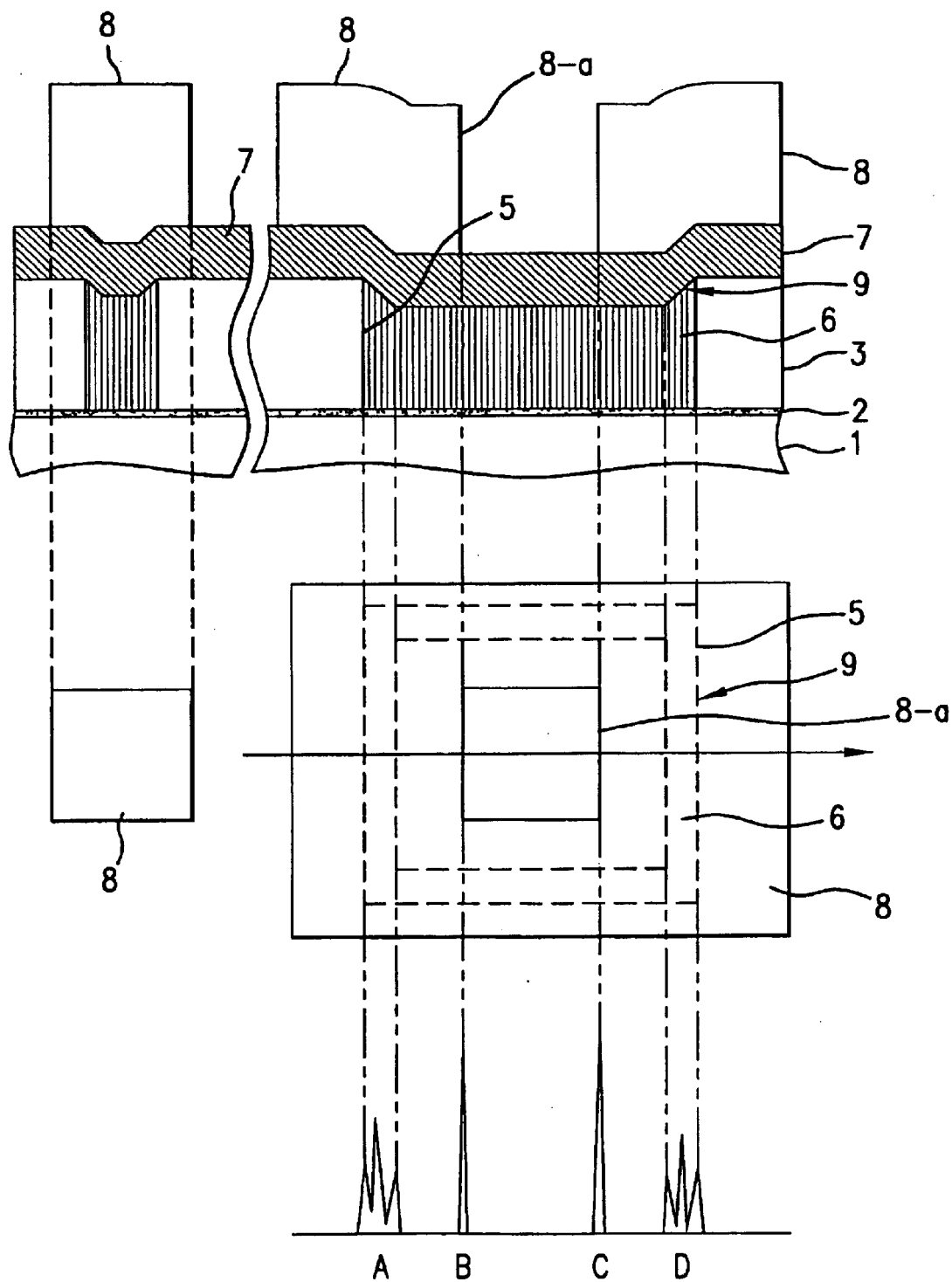
FIG. 2 shows a conventional alignment pattern over a substrate in a fragmentary cross sectional view and a fragmentary plan view as well as waveform peaks representing the steps.

As described above, the deep alignment hole 12 penetrates not only the inter-layer insulator 20 but also the field oxide film 13. The deep alignment hole 12 has a larger aspect ratio which is defined to be a ratio of a depth to a diameter. Both the larger aspect ratio and the large diameter of the alignment hole 12 causes a large plug loss by a chemical mechanical polishing. The term "plug loss" is a difference in level between the planarized surface of the metal plug subjected to the chemical mechanical polishing. The large plug loss allows the second sloped surfaces with a remarkable level-difference to be formed on the periphery of the upper surface of the tungsten plug 14 within the alignment hole 12 even the planarization to the tungsten plug 14 is carried out by the chemical mechanical polishing. Both the large aspect ratio and the large diameter or horizontal size of the alignment hole 12 allow the chemical mechanical polishing to cause a large plug loss in the alignment hole 12 or form a large level difference "d" between the top surface of the inter-layer insulator 20 and the second lower level flat surface of the tungsten plug 14 within the alignment hole 12. A typical example of the level difference "d" may be not less than about 200 nanometers as shown in FIG. 4C, which is not less than four times of the level difference "d" shown in FIG. 1B which describes the conventional alignment pattern. This demonstrates that the deeper and larger size alignment hole 12 with a large aspect ratio causes the large level difference "d" or the large plug loss and forms remarkable sloped surfaces which bound between the second lower level flat surface of the tungsten plug 14 within the alignment hole 12 and the top surface of the inter-layer insulator 20.

An aluminum interconnection layer 15 for a first level interconnection is formed by a sputtering method over the top surface of the inter-layer insulator 20 and also over the first lower level flat surface and the first sloped surfaces of the tungsten plug 14 within the contact hole 11 as well as over the second lower level flat surface and the second sloped surfaces of the tungsten plug 14 within the alignment hole 12. The aluminum interconnection layer 15 has a surface which reflects the top surfaces of the inter-layer insulator 20 and the tungsten plugs 14 within the contact hole 11 and the alignment hole 12. Namely, the top surface of the inter-layer insulator 20 has a top flat surface which reflects the top surface of the inter-layer insulator 20, small sloped surfaces which reflect the first sloped surfaces of the tungsten plug 14 within the contact hole 11, a lower level flat surface which reflect the first lower level flat surface of the tungsten plug 14 within the contact hole 11, and large dual-sloped surfaces which reflect the second sloped surfaces of the tungsten plug 14 within the alignment hole 12, a lower level flat surface which reflect the second lower level flat surface of the tungsten plug 14 within the alignment hole 12.

With reference back to FIG. 3, a resist pattern 17 is formed over the aluminum interconnection layer 15. The resist pattern 17 has a surface which reflects the top surfaces of the inter-layer insulator 20 and the tungsten plugs 14 within the contact hole 11 and the alignment hole 12, wherein the surface of the resist pattern 17 has first steps 17a which reflect the large dual-sloped surfaces of the aluminum interconnection layer 15, and wherein the large dual-sloped surfaces are caused by the second sloped surfaces with the level difference "d" of the tungsten plug 14 within the alignment hole 12. The resist pattern 17 also has a rectangle-shaped opening with second steps 17b which are positioned inside of the first steps 17a. namely, the rectangle-shaped opening of the resist pattern 17 is, in plan view, within the alignment hole 12. A part of the aluminum interconnection layer 15 is exposed through the rectangle-shaped opening of the resist pattern 17. The resist pattern 17 is used as a mask for patterning the aluminum interconnection layer 15. An alignment of the resist pattern 17 with reference to the aluminum interconnection layer 15 is made by detecting the second steps 17b of the rectangle-shaped opening of the resist pattern 17 with reference to the box-mark 16 which comprises the second sloped surfaces in the alignment hole 12. In other words, the alignment is made by detecting the box-mark 16 which comprises the second sloped surfaces in the alignment hole 12 with reference to the second steps 17b of the rectangle-shaped opening of the resist pattern 17.

A scanning to the surface of the resist pattern 17 and the aluminum interconnection layer 15 is made in a direction shown in an arrow mark across a pair of opposite sides of the box-mark 16 as shown in FIG. 3. As a result of the scanning, any level-differences can be detected as peak waveforms. The presence of the box-mark 16 which comprises the second sloped surfaces forms large dual-sloped surfaces 17a of the resist pattern 17. The large dual-sloped surfaces 17a of the resist pattern 17 due to the presence of the box-mark 16 are represented to be peak waveforms "A" and "D". The resist pattern 17 also has the square-shaped resist pattern hole with steps 17b, so that a part of the aluminum interconnection layer 15 over the second lower-level flat surface of the tungsten plug 14 within the alignment hole 12 is exposed through the resist pattern hole with the steps 17b of the resist pattern 17. A periphery with the steps 17b of the resist pattern hole is represented to be peak waveforms "B" and "C". Based on the detected peak waveforms "A", "B", "C" and "D", any miss-alignment is adjusted. The peak waveforms "A", "B", "C" and "D" indicate respective optical intensities detected.

In accordance with the present invention, the deep alignment hole 12 penetrates not only the inter-layer insulator 20 but also the field oxide film 13. The deep alignment hole 12 has a larger aspect ratio which is defined to be a ratio of a depth to a diameter. Both the larger aspect ratio and the large diameter of the alignment hole 12 cause a large plug loss or a large level difference "d" by the chemical mechanical polishing. The large plug loss or the large level difference "d" allows the second sloped surfaces with a remarkable level-difference to be formed on the periphery of the upper surface of the tungsten plug 14 within the alignment hole 12 even the planarization to the tungsten plug 14 was carried out by the chemical mechanical polishing. The remarkable level-difference or the remarkable sloped surfaces of the box-mark 16 causes a remarkable or sharp peak waveform which makes it easy to detect the further sloped surfaces 17a or the level-difference of the surface of the resist pattern 17.

Meanwhile, the degree of miss-alignment of the resist pattern 17 with reference to the alignment hole 12 may be detected by comparing a first distance and a second distance, wherein the first distance is defined to be a distance between the waveform peak "B" representing one step 17b of the resist pattern hole and the waveform peak "A" representing one sloped step of the box-mark 16, while the second distance is defined to be another distance between the waveform peak "C" representing opposite step 17b of the resist pattern hole and the waveform peak "D" representing opposite sloped step of the box-mark 16. If the first and second distance are substantially the same, then this means that the alignment is almost perfect. The degree of the miss-alignment may read on the difference between the first and second distances or read on the degree of asymmetry.

The remarkable waveform peaks, due to the remarkable level-difference or the remarkable sloped surfaces of the box-mark 16 caused by the larger aspect ratio of the deeper alignment hole 12, ensure a desired high accuracy in measuring the difference between the first and second distances or in detecting the degree of the miss-alignment. If the difference between the first and second distances is larger than a predetermined tolerance, then the resist pattern 17 is removed, and then a new resist pattern 17 is formed over the aluminum interconnection layer 15. For the new resist pattern 17, the highly accurate measurement for alignment will again be made in the same manners as described above. If the difference between the first and second distances is smaller than the predetermined tolerance, then this means that the resist pattern 17 is usable.

Figure 4E:
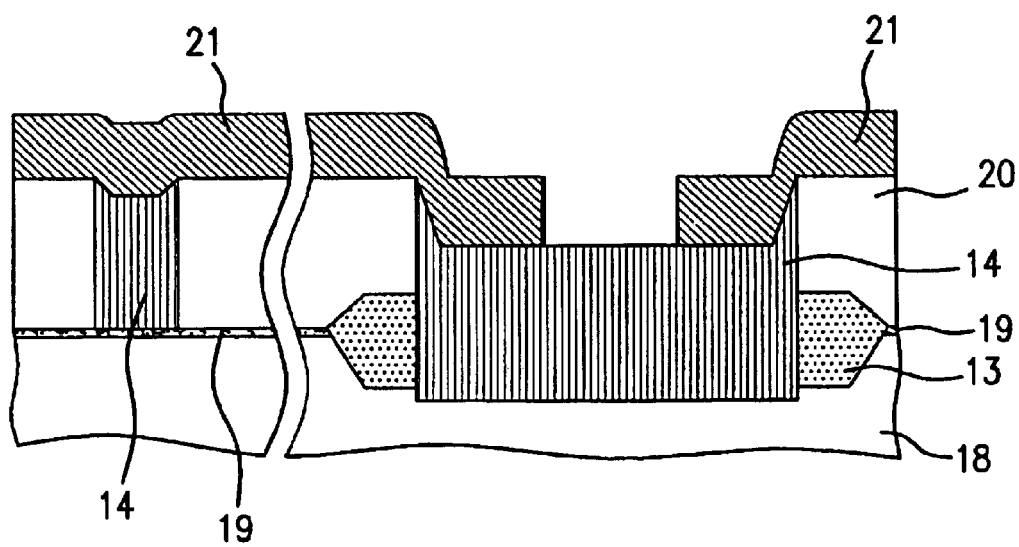

As shown in FIG. 4E, the aluminum interconnection layer 15 is selectively removed by use of the resist pattern 17 as a mask to form a first level aluminum interconnection 21. The used resist pattern 17 is then removed.

As described above, the deep alignment hole 12 penetrates not only the inter-layer insulator 20 but also the field oxide film 13. The deep alignment hole 12 has a larger aspect ratio which is defined to be a ratio of a depth to a diameter. Both the larger aspect ratio and the large diameter of the alignment hole 12 causes a large plug loss by a chemical mechanical polishing. The large plug loss allows the second sloped surfaces with a remarkable level-difference to be formed on the periphery of the upper surface of the tungsten plug 14 within the alignment hole 12 even the planarization to the tungsten plug 14 is carried out by the chemical mechanical polishing. Both the large aspect ratio and the large diameter or horizontal size of the alignment hole 12 allow the chemical mechanical polishing to cause a large plug loss in the alignment hole 12 or form a large level difference "d" between the top surface of the inter-layer insulator 20 and the second lower level flat surface of the tungsten plug 14 within the alignment hole 12. The level difference "d" as shown FIG. 4C may be not less than four times of the level difference "d" shown in FIG. 1B which describes the conventional alignment pattern. This demonstrates that the deeper and larger size alignment hole 12 with a large aspect ratio causes the large level difference "d" or the large plug loss and forms remarkable sloped surfaces which bound between the second lower level flat surface of the tungsten plug 14 within the alignment hole 12 and the top surface of the inter-layer insulator 20.

The remarkable level-difference or the remarkable sloped surfaces of the box-mark 16 causes a remarkable or sharp peak waveform which makes it easy to detect the further sloped surfaces 17a or the level-difference of the surface of the resist pattern 17. The remarkable waveform peaks, due to the remarkable level-difference or the remarkable sloped surfaces of the box-mark 9 caused by the larger aspect ratio of the deeper alignment hole 12, ensure a desired high accuracy in alignment of the resist pattern 17 with reference to the aluminum interconnection layer 15.

As described above, the deep alignment hole 12 penetrates not only the inter-layer insulator 20 but also the field oxide film 13. Namely, the field oxide film 13 serving as a device isolation is formed not only in an isolation region (not illustrated) but also over the alignment pattern formation region. The field oxide film 13 may be formed by one of available methods, for example, a local oxidation of silicon (LOCOS) method, a recessed local oxidation of silicon (recessed LOCOS) method, and a trench isolation method.

Figure 5A:
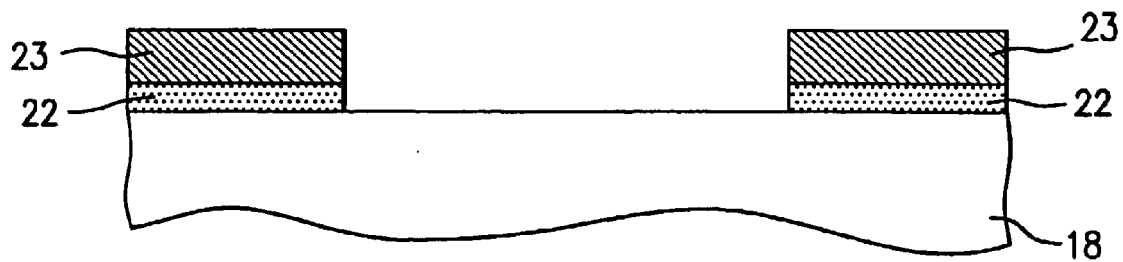
FIGS. 5A through 5C are fragmentary cross sectional elevation views of sequential steps involved in a local oxidation of silicon (LOCOS) method for selectively forming a field oxide film serving as a device isolation over the surface of the silicon substrate.
Figure 5B:
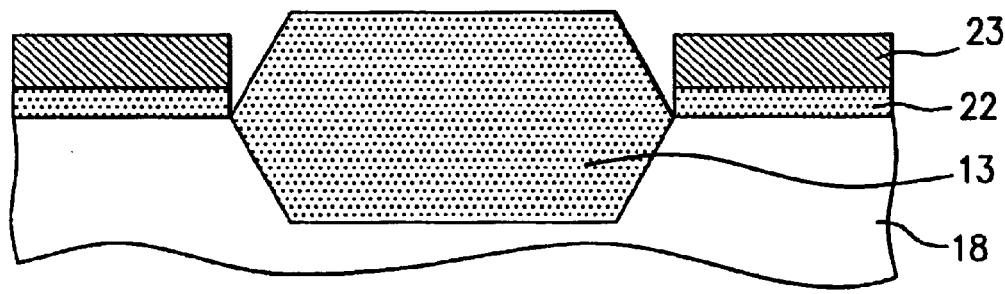
Figure 5C:
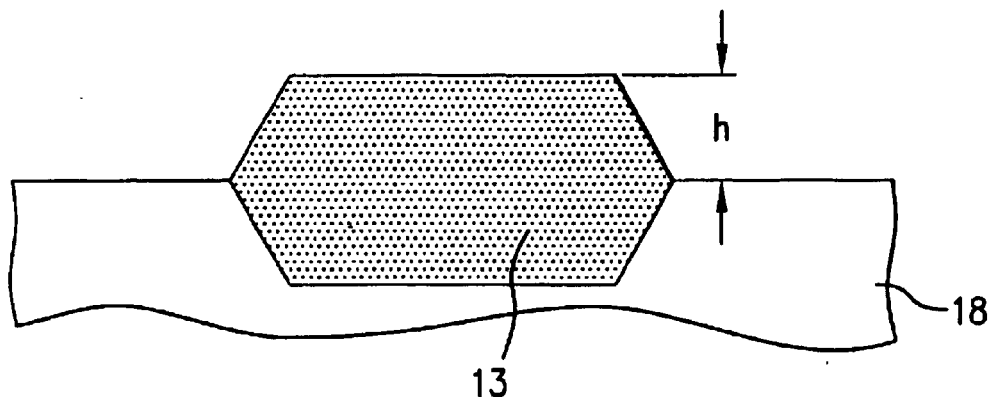

FIGS. 5A through 5C are fragmentary cross sectional elevation views of sequential steps involved in a local oxidation of silicon (LOCOS) method for selectively forming a field oxide film sewing as a device isolation over the surface of the silicon substrate.

With reference to FIG. 5A, a silicon dioxide film 22 is formed over a surface of the silicon substrate 18. A silicon nitride film 23 is then deposited over the silicon dioxide film 22 to form a lamination structure over the silicon substrate 18. Laminations of the silicon nitride film 23 and the silicon dioxide film 22 on the device isolation region are selectively removed by a selective etching process, so that the surface of the silicon substrate 18 on the device isolation region is exposed.

With reference to FIG. 5B, a thermal oxidation of silicon is carried out by using the remaining laminations of the silicon nitride film 23 and the silicon dioxide film 22 as a mask, thereby to selectively form a field oxide film 13 of silicon dioxide over the exposed surface of the silicon substrate 18 on the device isolation region.

With reference to FIG. 5C, the remaining laminations of the silicon nitride film 23 and the silicon dioxide film 22 are removed, whereby the field oxide film 13 remains over the silicon substrate 18 on the device isolation region, wherein the field oxide film 13 comprises an upper half portion and a lower half portion. The upper half portion is positioned above the surface of the silicon substrate 18 and projects from the surface of the silicon substrate 18. The lower half portion is positioned below the surface of the silicon substrate 18 or buried within the upper region of the silicon substrate 18. The upper half portion has a thickness or a height "h" of about 300–400 nanometers.

Figure 6A:
FIGS. 6A through 6C are fragmentary cross sectional elevation views of sequential steps involved in a recessed local oxidation of silicon (recessed LOCOS) method for selectively forming a field oxide film serving as a device isolation over the surface of the silicon substrate.
Figure 6B:
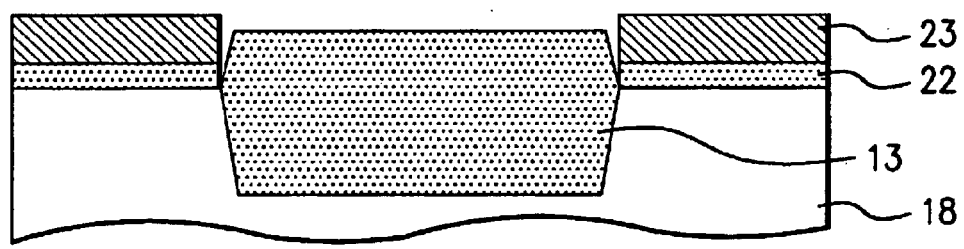
Figure 6C:
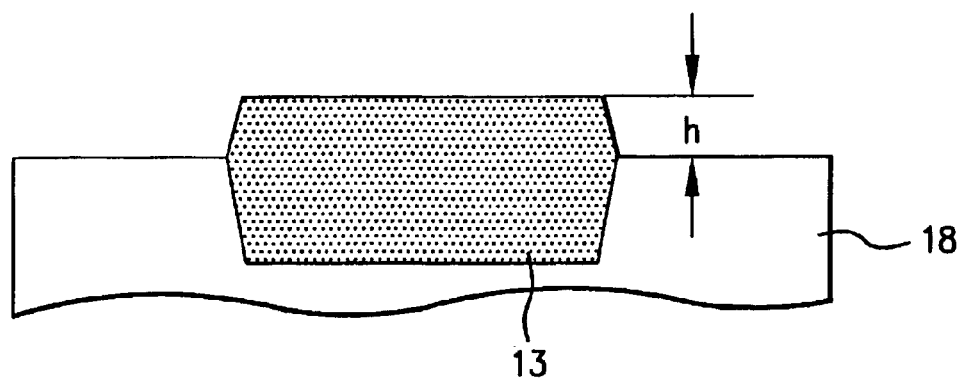

FIGS. 6A through 6C are fragmentary cross sectional elevation views of sequential steps involved in a recessed local oxidation of silicon (recessed LOCOS) method for selectively forming a field oxide film serving as a device isolation over the surface of the silicon substrate.

With reference to FIG. 6A, a silicon dioxide film 22 is formed over a surface of the silicon substrate 18. A silicon nitride film 23 is then deposited over the silicon dioxide film 22 to form a lamination structure over the silicon substrate 18. Laminations of the silicon nitride film 23 and the silicon dioxide film 22 on the device isolation region as well as an upper region of the silicon substrate 18 on the device isolation region are selectively removed by a selective etching process, so that the recessed surface of the silicon substrate 18 on the device isolation region is exposed.

With reference to FIG. 6B, a thermal oxidation of silicon is carried out by using the remaining laminations of the silicon nitride film 23 and the silicon dioxide film 22 as a mask, thereby to selectively form a field oxide film 13 of silicon dioxide over the exposed recessed surface of the silicon substrate 18 on the device isolation region.

With reference to FIG. 6C, the remaining laminations of the silicon nitride film 23 and the silicon dioxide film 22 are removed, whereby a majority of the field oxide film 13 remains within the silicon substrate 18 on the device isolation region, wherein the field oxide film 13 comprises an upper portion and a lower portion. The upper portion is positioned above the surface of the silicon substrate 18 and projects from the surface of the silicon substrate 18. The lower portion is positioned below the surface of the silicon substrate 18 or buried within the upper region of the silicon substrate 18. The upper portion has a thickness or a height "h" of about not more than 100 nanometers. The recessed portion of the silicon substrate 18 on the device isolation region causes that the lower portion of the field oxide film 13 is remarkably thicker than the upper portion of the field oxide film 13. Namely, a majority part of the field oxide film 13 is buried within the silicon substrate 18.

The field oxide film 13 is provided for allowing the formation of the deeper alignment hole with a larger aspect ratio for the purpose of forming the remarkable sloped surfaces, serving as the box-mark 16, of the tungsten plug 14 within the alignment hole 12. For this reason, it is better that the majority part of the field oxide film 13 is buried within the silicon substrate 18, and the field oxide film 13 is deeply buried within the silicon substrate 18.

FIGS. 7A through 7D are fragmentary cross sectional elevation views of sequential steps involved in a trench isolation method for selectively forming a field oxide film serving as a device isolation over the surface of the silicon substrate.

Figure 7A:
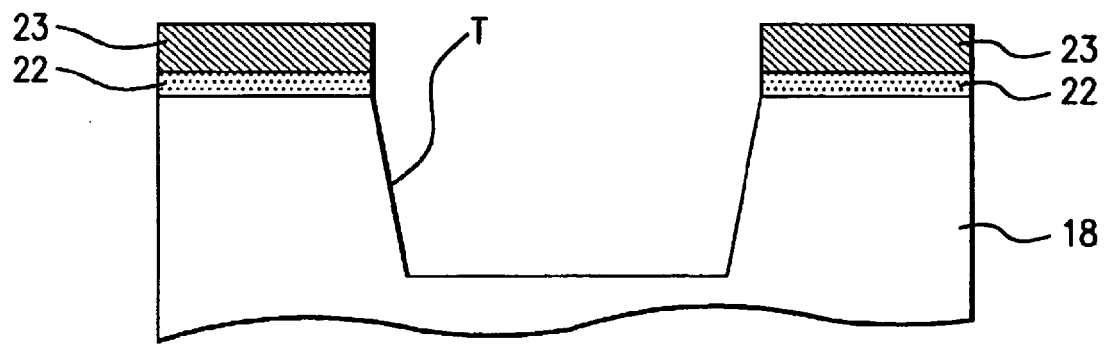
FIGS. 7A through 7D are fragmentary cross sectional elevation views of sequential steps involved in a trench isolation method for selectively forming a field oxide film serving as a device isolation over the surface of the silicon substrate.

With reference to FIG. 7A, a silicon dioxide film 22 is formed over a surface of the silicon substrate 18. A silicon nitride film 23 is then deposited over the silicon dioxide film 22 to form a lamination structure over the silicon substrate 18. Laminations of the silicon nitride film 23 and the silicon dioxide film 22 on the device isolation region as well as a selected region of the silicon substrate 18 on the device isolation region are selectively removed by a selective etching process, so that a trench groove "T" is formed in the silicon substrate 18 on the device isolation region.

Figure 7B:
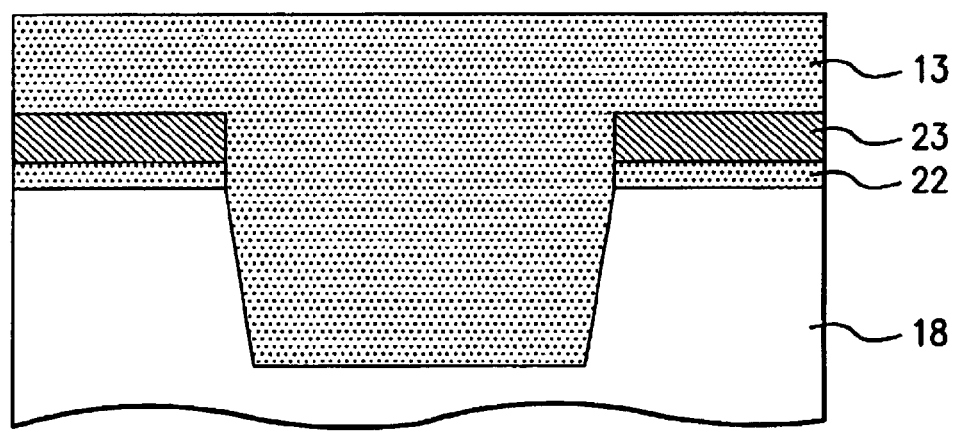

With reference to FIG. 7B, a silicon dioxide film 13 is deposited entirely over the silicon nitride film 23 and within the trench groove "T", whereby the trench groove "T" is completely filled with the deposited silicon dioxide film 13.

Figure 7C:
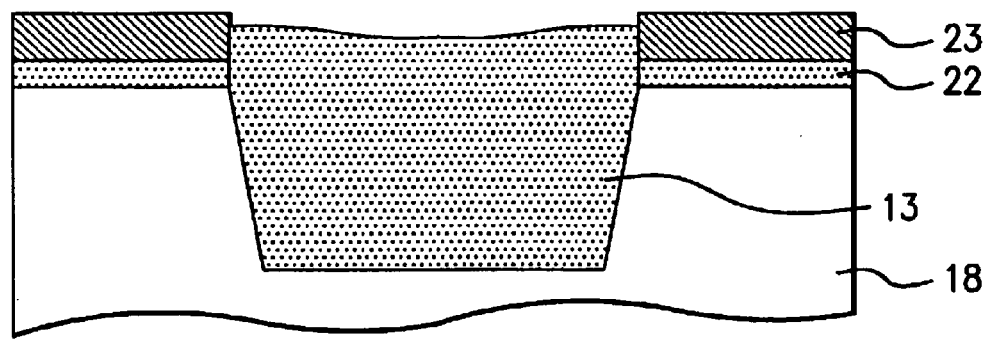

With reference to FIG. 7C, a chemical mechanical polishing is carried out to the silicon dioxide film 13 for removing the silicon dioxide film 13 over the silicon nitride film 23.

Figure 7D:
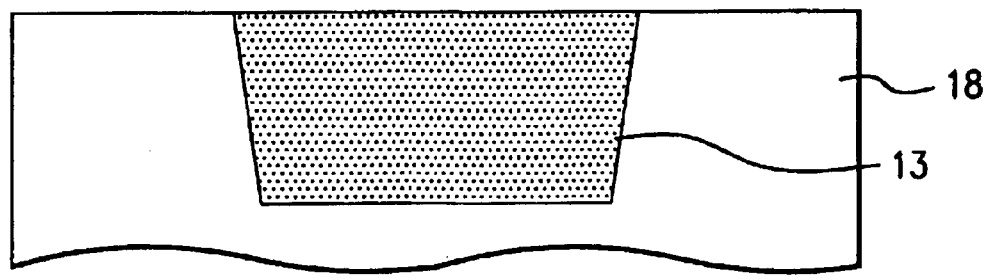

With reference to FIG. 7D, the remaining laminations of the silicon nitride film 23 and the silicon dioxide film 22 are removed, whereby the most part of the field oxide film 13 remains within the silicon substrate 18 on the device isolation region. The most part of the field oxide film 13 is positioned below the surface of the silicon substrate 18 or buried within the trench groove "T" of the silicon substrate 18. The trench groove "T" of the silicon substrate 18 on the device isolation region causes that the most part of the field oxide film 13 is buried within the silicon substrate 18 on the device isolation region.

The field oxide film 13 is provided for allowing the formation of the deeper alignment hole 12 with a larger aspect ratio for the purpose of forming the remarkable sloped surfaces, serving as the box-mark 16, of the tungsten plug 14 within the alignment hole 12. For this reason, it is much better that the most part of the field oxide film 13 is buried within the silicon substrate 18, and the field oxide film 13 is deeply buried within the silicon substrate 18.

FIGS. 8A through 8D are fragmentary cross sectional views of semiconductor devices with novel alignment patterns in sequential steps involved in another novel method for forming the novel alignment pattern in the modified embodiment in accordance with the present invention.

Figure 8A:
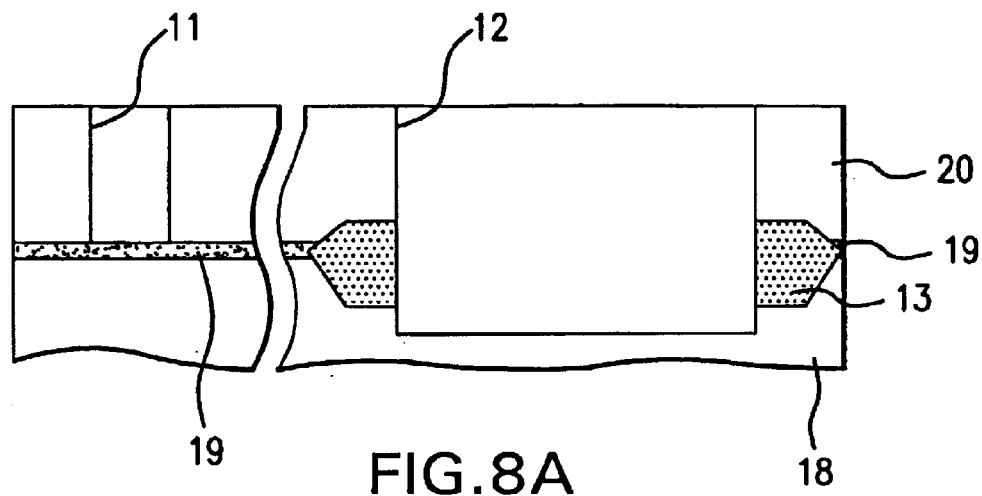
FIGS. 8A through 8D are fragmentary cross sectional views of semiconductor devices with novel alignment patterns in sequential steps involved in another novel method for forming the novel alignment pattern in the modified embodiment in accordance with the present invention.

As shown in FIG. 8A, a tungsten silicide film 19 is formed over a surface of a silicon substrate 18, wherein the tungsten silicide film 19 reduces a resistance of the diffusion layer. A field oxide film 13 is selectively formed over the surface of the silicon substrate 18, so that the field oxide film 13 extends over an alignment mark formation region, in which an alignment hole will be formed in later process, wherein a diameter or a horizontal size of the alignment hole is smaller than the alignment mark formation region. An inter-layer insulator 20 is formed over the tungsten silicide film 19 and the field oxide film 13. The inter-layer insulator 20 may comprise a boron phospho silicate glass. Alternatively, the inter-layer insulator 20 may also comprise a phospho silicate glass. The field oxide film 13 is preferably thicker than the usual field oxide film. An example of the thickness of the field oxide film 13 may be 300 nanometers. The field oxide film 13 has an upper part above the tungsten silicide film 19 and a lower part below the tungsten silicide film 19, wherein preferably, the lower part is thicker than the upper part. The field oxide film 13 deeply extends in the silicon substrate 18.

A scribe line for dividing a wafer comprises a diffusion layer. In a scribe line formation region, a contact hole 11 is formed in the inter-layer insulator 20 by a selective etching process, so that the contact hole 11 is positioned over the tungsten silicide film 19, wherein a bottom of the contact hole 11 reaches the tungsten silicide film 14. The contact hole 11 may have a diameter which may be not larger than 0.5 micrometers. The contact hole 11 is to connect an interconnection and an internal circuit. Further, an alignment hole 12 is formed on the alignment hole formation region, wherein the alignment bole 12 penetrates the inter-layer insulator 20 and the field oxide film 13 so that a bottom of the alignment hole 12 reaches an upper region of the silicon substrate 18, whereby a part of the silicon substrate 18 is exposed through the alignment hole 12. The alignment hole 12 may have a diameter of not smaller than 15 micrometers. A typical example of the thickness of the alignment hole 12 may be about 40 micrometers. A diameter or size of the alignment hole 12 is also much larger than the contact hole 11 to cause required remarkable slopes on a periphery of the top of the alignment hole 5. The bottom level of the alignment hole 12 is deeper than the bottom level of the contact hole 11, and also deeper than the bottom level of the field oxide film 13. In this example, the bottom level of the alignment hole 12 is deeper than the bottom level of the field oxide film 13 and reaches the upper region of the silicon substrate 18. Alternatively, it is also possible that the alignment hole 12 reaches the field oxide film 13 but does not penetrate the field oxide film 13, wherein the bottom level of the alignment hole 12 is just or in the vicinity of the bottom level of the field oxide film 13.

Figure 8B:
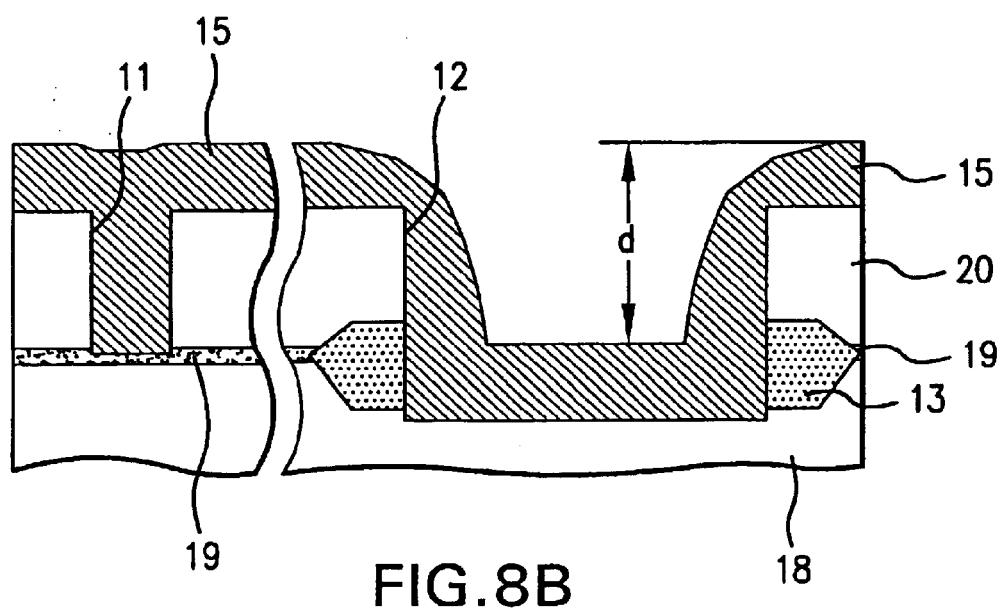
Figure 8C:
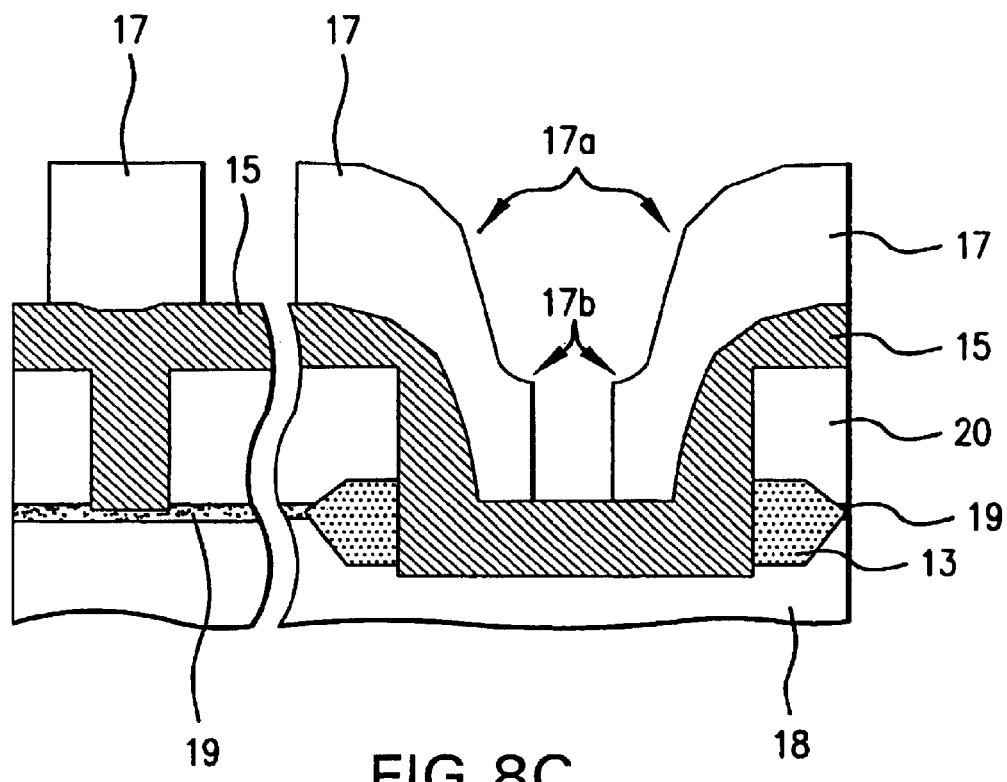

As shown in FIG. 8B, an aluminum interconnection layer 15 is deposited by a sputtering method over the top surface of the inter-layer insulator 20 and within the contact hole 11 and the alignment hole 12. The contact hole 11 is completely filled by the aluminum interconnection layer 15, while the alignment hole 12 is partially filled by the aluminum interconnection layer 15. The aluminum interconnection layer 15 and the inter-layer insulator 20 are re-flown for planarization thereof. The aluminum interconnection layer 15 within the contact hole 11 is in contact with the tungsten silicide film 19, while the aluminum interconnection layer 15 within the alignment hole 12 is in contact with the silicon substrate 18.

There is a level-difference "d" between the surface of the aluminum interconnection layer 15 over the top surface of the inter-layer insulator 20 and the surface of the aluminum interconnection layer 15 on the bottom of the alignment hole 12. Namely, the aluminum interconnection layer 15 has the level-difference "d" between over the top surface of the inter-layer insulator 20 and over the bottom of the alignment hole 12. The level-difference "d" shown in FIG. 8B is much larger than the level-difference "d" shown in FIG. 1B. The surface of the aluminum interconnection layer 15 includes sloped surfaces serving as an alignment pattern which are positioned over a periphery of the alignment hole 12.

As shown in FIG. 8B, a resist pattern 17 is formed over the aluminum interconnection layer 15. The resist pattern 17 has a surface which reflects the top surfaces of the inter-layer insulator 20 and the aluminum interconnection layer 15 within the contact hole 11 and the alignment hole 12, wherein the surface of the resist pattern 17 has first steps 17a which reflect the sloped surfaces of the aluminum interconnection layer 15 over the periphery of the alignment hole 12. The sloped surfaces 17a included in the upper surface of the aluminum interconnection layer 15 within the alignment hole 12 form an alignment pattern. The resist pattern 17 has a rectangle-shaped opening. An alignment is made by detecting the alignment pattern with reference to second steps 17b of the rectangle-shaped opening of the resist pattern 17.

In order to detect the alignment pattern, a scanning to the surface of the resist pattern 17 and the aluminum interconnection layer 15 is made in the same manner as described above with reference to FIG. 3. As a result of the scanning, any level-differences can be detected as peak waveforms. The presence of the alignment-mark which comprises the sloped surfaces forms large sloped surfaces 17a of the resist pattern 17. The resist pattern 17 also has a square-shaped resist pattern hole with steps 17b, so that a part of the aluminum interconnection layer 15 within the alignment hole 12 is exposed through the resist pattern hole with the steps 17b of the resist pattern 17.

In accordance with the present invention, the deep alignment hole 12 penetrates not only the inter-layer insulator 20 but also the field oxide film 13. The deep alignment bole 12 allows the second sloped surfaces with a remarkable level-difference to be formed on the upper surface of the aluminum interconnection layer 15 at the periphery of the alignment hole 12. The remarkable level-difference or remarkable sloped surfaces of the alignment-mark causes a remarkable or sharp peak waveform which makes it easy to detect the further sloped surfaces 17a or the level-difference of the surface of the resist pattern 17.

The remarkable waveform peaks, due to the remarkable level-difference or the remarkable sloped surfaces of the alignment-mark caused by the deeper alignment hole 12, ensure a desired high accuracy in measuring the difference between the first and second distances or in detecting the degree of the miss-alignment.

If the difference between the first and second distances is larger than a predetermined tolerance, then the resist pattern 17 is removed, and then a new resist pattern 17 is formed over the aluminum interconnection layer 15. For the new resist pattern 17, the alignment will again be made in the same manners as described above. If the difference between the first and second distances is smaller than the predetermined tolerance, then this means that the resist pattern 17 is usable.

Figure 8D:
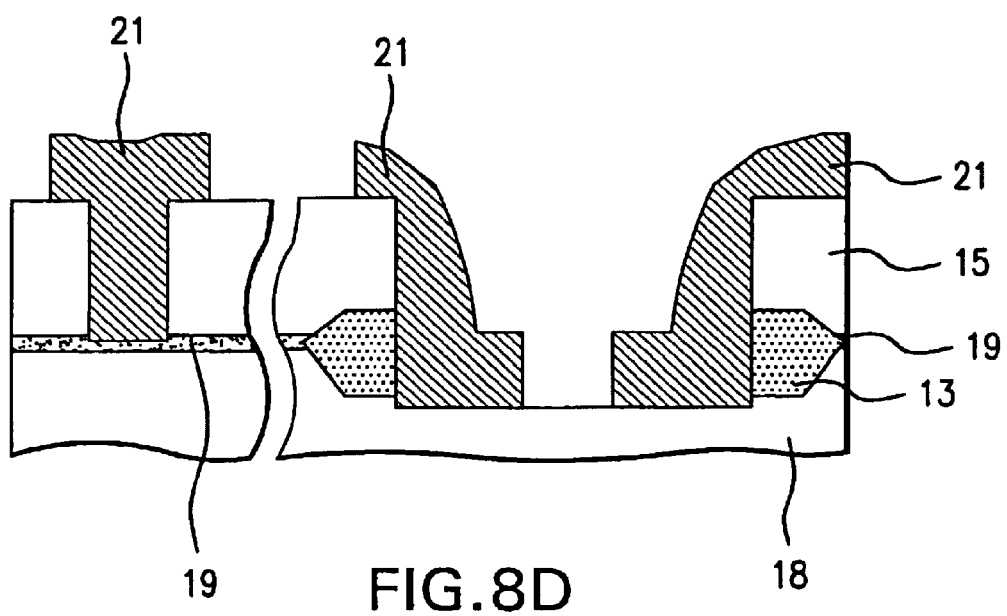

As shown in FIG. 8D, the aluminum interconnection layer 15 is selectively removed by use of the resist pattern 17 as a mask to form a first level aluminum interconnection 21. The used resist pattern 17 is then removed.

As described above, the surface of the aluminum interconnection layer 15 has a sufficiently large level-difference "d" which enables sharp and remarkable peak waveforms.

In accordance with the foregoing present inventions, the field oxide film 13 is formed on the alignment region of the surface of the silicon substrate 18, and the inter-layer insulator 20 is then formed over the field oxide film 13 and the surface of the silicon substrate 18. The contact hole 11 and the alignment hole 12 are formed in the inter-layer insulator 20, wherein the alignment hole 12 is positioned in the alignment region. The presence of the field oxide film 13 on the alignment region allows formation of the alignment hole 12 which is larger in diameter or horizontal size and deeper in bottom-level than the contact hole 11.

The tungsten plug 14 is formed to completely fill the contact hole 11 and the alignment hole 12 before planarization of the tungsten plug 14 by the chemical mechanical polishing is carried out so that the tungsten plug 14 remains only within the contact hole 11 and the alignment hole 12, wherein the large depth of the alignment hole 12 causes a remarkable plug loss which causes remarkable sloped surfaces which provide boundaries between the lower level flat surface of the tungsten plug 14 within the alignment hole 14 and the top surface of the inter-layer insulator 20, wherein the remarkable sloped surfaces serve as the alignment mark. The aluminum interconnection layer 15 is formed over the top surface of the inter-layer insulator 20 and over the surfaces of the tungsten plugs 14 within the contact hole 11 and the alignment hole 12. The resist pattern 17 is also formed over the aluminum interconnection layer 15. The resist pattern 17 has a resist pattern hole for patterning the underlying aluminum interconnection layer 15. The surface of the resist pattern 17 reflects the above remarkable sloped surfaces serve as the alignment mark. The alignment is made by measuring horizontal distances between opposite edges of the resist pattern hole and the remarkable sloped surfaces serve as the alignment mark.

Alternatively, without formation of the tungsten plug 14, the aluminum interconnection layer 15 is formed over the top surface of the inter-layer insulator 20 and within the contact hole 11 and the alignment hole 12. Even after the inter-layer insulator 20 and the aluminum interconnection layer 15 are re-flown, the surface of the aluminum interconnection layer 15 has a large level-difference "d" between over the top surface of the inter-layer insulator 20 and on the bottom of the alignment hole 12. The resist pattern 17 is also formed over the aluminum interconnection layer 15. The resist pattern 17 has a resist pattern hole for patterning the underlying aluminum interconnection layer 15. The surface of the resist pattern 17 reflects the above remarkable sloped surfaces serve as the alignment mark. The highly accurate alignment may be made by measuring horizontal distances between opposite edges of the resist pattern hole and the remarkable sloped surfaces serve as the alignment mark.

Even the chemical mechanical polishing or the reflow process is made for planarization to the tungsten plug 14, then the sloped surfaces with the remarkable level-difference serving as the alignment mark may be formed. The highly accurate measurement for alignment may be made by measuring horizontal distances between opposite edges of the resist pattern hole and the remarkable sloped surfaces serve as the alignment mark. If the degree of miss-alignment is larger than a predetermined tolerance, then the resist pattern 17 is removed, and then a new resist pattern 17 is formed over the aluminum interconnection layer 15. For the new resist pattern 17, the highly accurate measurement for alignment will again be made in the same manners as described above. If the degree of miss-alignment is smaller than the predetermined tolerance, then this means that the resist pattern 17 is usable. The manner for ensuring the detection of any unacceptable miss-alignment ensures the formation of the well-aligned resist pattern 17, thereby causing a high yield of the semiconductor device.

The field oxide film 13 may be formed by the essential process for forming the normal semiconductor device, but not any additional process. Namely, no additional process is needed for forming the field oxide film 13 on the alignment region.

It is also preferable that the alignment region is formed in the device isolation region of the semiconductor chip, so that the formation of the alignment region provide no influence to the yield of the semiconductor wafer.

The field oxide film 13 on the alignment region progresses the etching process, resulting in a formation of the deep alignment hole 12 which penetrates not only the inter-layer insulator 20 but also the field oxide film 13, so that the deep alignment hole 12 has a larger aspect ratio and a larger diameter or horizontal size. Both the larger aspect ratio and the large diameter or horizontal size of the alignment hole 12 cause a large plug loss by a chemical mechanical polishing. The large plug loss allows the sloped surfaces with a remarkable level-difference to be formed on the periphery of the upper surface of the tungsten plug 14 within the alignment hole 12 even the planarization to the tungsten plug 14 is carried out by the chemical mechanical polishing. The remarkable level-difference or remarkable sloped surfaces of the alignment-mark causes a remarkable or sharp peak waveform which makes it easy to detect the further sloped surfaces or the level-difference of the surface of the resist pattern.

In accordance with the present invention, the alignment pattern may comprise the sloped surfaces which provide boundaries between the top surface of the inter-layer insulator and the lower level flat surface of the metal plug within the alignment hole formed in the inter-layer insulator, wherein the alignment hole has a bottom level which is deeper than the bottom level of the inter-layer insulator and at least reaches the field oxide film under the inter-layer insulator, whereby the alignment hole has a larger aspect ratio which causes the remarkable sloped surfaces serving as the alignment pattern. The remarkable sloped surfaces serving as the alignment pattern allows a highly accurate measurement for alignment of the resist pattern which extends over the metal interconnection layer.

In accordance with the present invention, the alignment pattern may also comprise the sloped surfaces of the metal interconnection layer over the periphery of the alignment hole formed in the inter-layer insulator, wherein the alignment hole has a bottom level which is deeper than the bottom level of the inter-layer insulator and at least reaches the field oxide film under the inter-layer insulator, whereby the alignment hole has a larger aspect ratio which causes the remarkable sloped surfaces serving as the alignment pattern. The remarkable sloped surfaces serving as the alignment pattern allows a highly accurate measurement for alignment of the resist pattern which extends over the metal interconnection layer.

In the above described embodiments, the alignment mark is the box-mark. The alignment mark may be any available mark with any available shape which enables the alignment in both horizontal directions, for example, X-direction and Y-direction, which are perpendicular to each other.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. An alignment pattern comprising: at least a sloped surface which communicates between a top surface of an inter-layer insulator extending over a surface of a substrate and a field oxide film selectively formed over said surface of said substrate and a flat surface of a metal plug having the flat surface and an inclined surface, and said flat surface being lower in level than said top surface of said inter-layer insulator, and said metal plug being buried within an alignment hole which completely penetrates said inter-layer insulator and at least reaches said field oxide film, so that said alignment hole has a bottom level which is deeper than a bottom level of said inter-layer insulator.

2. The alignment pattern as claimed in claim 1, wherein said alignment hole completely penetrates not only said inter-layer insulator but also said field oxide film, so that said bottom level of said alignment hole is deeper than a bottom level of said field oxide film.

3. The alignment pattern as claimed in claim 1, wherein said alignment hole has an aspect ratio which ensures that said at least sloped surface be remarkable even said at least sloped surface is obtained by a chemical mechanical polishing process for said metal plug.

4. The alignment pattern as claimed in claim 1, wherein said at least sloped surface has a level-difference of not less than 200 nanometers.

5. The alignment pattern as claimed in claim 1, wherein said field oxide film comprises an upper half portion above said surface of said substrate and a lower half portion below said surface of said substrate, and said lower half portion is thicker than said upper half portion.

6. The alignment pattern as claimed in claim 1, wherein a majority part of said field oxide film is buried within said substrate.

7. The alignment pattern as claimed in claim 1, wherein at least a most part of said field oxide film is buried within said substrate.

8. A semiconductor device including:
   a substrate;
   a field oxide film selectively formed over said substrate;
   an inter-layer insulator extending over a surface of said substrate and said field oxide film;
   an alignment hole which completely penetrates said inter-layer insulator and at least reaches said field oxide film, so that said alignment hole has a bottom level which is deeper than a bottom level of said inter-layer insulator; and
   a metal plug buried within said alignment hole, said metal plug having a flat surface lower in level than a top surface of said inter-layer insulator and sloped surfaces serving as an alignment pattern which communicate between said top surface of said inter-layer insulator and said flat surface of said metal plug.

9. The semiconductor device as claimed in claim 8, wherein said alignment hole completely penetrates not only said inter-layer insulator but also said field oxide film, so that said bottom level of said alignment hole is deeper than a bottom level of said field oxide film.

10. The semiconductor device as claimed in claim 8, wherein said alignment hole has an aspect ratio which ensures that said at least sloped surface be remarkable even said at least sloped surface is obtained by a chemical mechanical polishing process for said metal plug.

11. The semiconductor device as claimed in claim 8, wherein said at least sloped surface has a level-difference of not less than 200 nanometers.

12. The semiconductor device as claimed in claim 8, wherein said field oxide film comprises an upper half portion above said surface of said substrate and a lower half portion below said surface of said substrate, and said lower half portion is thicker than said upper half portion.

13. The alignment pattern as claimed in claim 8, wherein a majority part of said field oxide film is buried within said substrate.

14. The alignment pattern as claimed in claim 8, wherein at least a most part of said field oxide film is buried within said substrate.

15. An alignment pattern comprising:
   sloped surfaces of an interconnection layer extending both over a top surface of an inter-layer insulator and within an alignment hole, and said sloped surfaces being positioned over a periphery of said alignment hole, and said inter-layer insulator extending over a surface of a substrate and a field oxide film selectively formed over said surface of said substrate, and said alignment hole completely penetrating said inter-layer insulator and at least reaches said field oxide film, so that said alignment hole has a bottom level which is deeper than a bottom level of said inter-layer insulator,
   wherein said interconnection layer directly contacts said substrate within said alignment hole.

16. The alignment pattern as claimed in claim 15, wherein said alignment hole completely penetrates not only said inter-layer insulator but also said field oxide film, so that said bottom level of said alignment hole is deeper than a bottom level of said field oxide film.

17. The alignment pattern as claimed in claim 15, wherein said alignment hole has an aspect ratio which ensures that said at least sloped surface be remarkable even said interconnection layer is re-flown.

18. An alignment pattern comprising:
   sloped surfaces of an interconnection layer extending both over a top surface of an inter-layer insulator and within an alignment hole, and said sloped surfaces being positioned over a periphery of said alignment hole, and said inter-layer insulator extending over a surface of a substrate and a field oxide film selectively formed over said surface of said substrate, and said alignment hole completely penetrating said inter-layer insulator and at least reaches said field oxide film, so that said alignment hole has a bottom level which is deeper than a bottom level of said inter-layer insulator,
   wherein said field oxide film comprises an upper half portion above said surface of said substrate and a lower half portion below said surface of said substrate, and said lower half portion is thicker than said upper half portion.

19. The alignment pattern as claimed in claim 15, wherein a majority part of said field oxide film is buried within said substrate.

20. A semiconductor device including:
   a substrate;
   a field oxide film selectively formed over said substrate;
   an inter-layer insulator extending over a surface of said substrate and said field oxide film;
   an alignment hole which completely penetrates said inter-layer insulator and at least reaches said field oxide film, so that said alignment hole has a bottom level which is deeper than a bottom level of said inter-layer insulator; and
   an interconnection layer extending both over said top surface of said inter-layer insulator and within said alignment hole, and said interconnection layer having sloped surfaces serving as an alignment pattern positioned over a periphery of said alignment hole, wherein said interconnection layer directly contacts said substrate within said alignment hole.

21. The semiconductor device as claimed in claim 20, wherein said alignment hole completely penetrates not only said inter-layer insulator but also said field oxide film, so that said bottom level of said alignment hole is deeper than a bottom level of said field oxide film.

22. The semiconductor device as claimed in claim 20, wherein said alignment hole has an aspect ratio which ensures that said at least sloped surface be remarkable even said interconnection layer is re-flown.

23. A semiconductor device including:

a substrate;

a field oxide film selectively formed over said substrate;

an inter-layer insulator extending over a surface of said substrate and said field oxide film;

an alignment hole which completely penetrates said inter-layer insulator and at least reaches said field oxide film, so that said alignment hole has a bottom level which is deeper than a bottom level of said inter-layer insulator; and an interconnection layer extending both over said top surface of said inter-layer insulator and within said alignment hole, and said interconnection layer having sloped surfaces serving as an alignment pattern positioned over a periphery of said alignment hole, wherein said field oxide film comprises an upper half portion above said surface of said substrate and a lower half portion below said surface of said substrate, and said lower half portion is thicker than said upper half portion.

24. The semiconductor device as claimed in claim 20, wherein a majority part of said field oxide film is buried within said substrate.

25. The alignment pattern of claim 1, further comprising, a metal layer that is directly on said top surface of said inter-layer insulator, said flat surface of said metal plug, and said sloped surface, and a resist directly on said metal layer, wherein said resist has a opening therein that extends to said metal layer over said metal plug, and wherein said sloped surface extends around a periphery of said opening.

26. The semiconductor device of claim 8, further comprising, a metal layer that is directly on said top surface of said inter-layer insulator, said flat surface of said metal plug, and said sloped surfaces, and a resist directly on said metal layer, wherein said resist has a opening therein that extends to said metal layer over said metal plug, and wherein said sloped surfaces extend around a periphery of said opening.

27. The alignment pattern of claim 15, further comprising a resist directly on said interconnection layer, wherein said resist has a opening therein that extends to said interconnection layer over said alignment hole, and wherein said sloped surfaces extend around a periphery of said opening.

28. The semiconductor device of claim 20, further comprising a resist directly on said interconnection layer, wherein said resist has a opening therein that extends to said interconnection layer over said alignment hole, and wherein said sloped surfaces extend around a periphery of said opening.

* * * * *